(12) United States Patent
Ishizawa et al.

(10) Patent No.: US 7,622,006 B2
(45) Date of Patent: Nov. 24, 2009

(54) PROCESSED BODY CARRYING DEVICE, AND PROCESSING SYSTEM WITH CARRYING DEVICE

(75) Inventors: Shigeru Ishizawa, Yamanashi (JP); Hiroaki Saeki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 212 days.

(21) Appl. No.: 10/500,102

(22) PCT Filed: Dec. 25, 2002

(86) PCT No.: PCT/JP02/13556

§ 371 (c)(1), (2), (4) Date: Jun. 25, 2004

(87) PCT Pub. No.: WO03/056624

PCT Pub. Date: Jul. 10, 2003

(65) Prior Publication Data

US 2005/0087300 A1 Apr. 28, 2005

(30) Foreign Application Priority Data

Dec. 25, 2001 (JP) ............................. 2001-392702

(51) Int. Cl.
- C23C 16/00 (2006.01)
- H01L 21/67 (2006.01)
- C23F 1/00 (2006.01)

(52) U.S. Cl. ............. 118/719; 156/345.24; 156/345.31; 156/345.32; 414/217; 414/935; 414/939

(58) Field of Classification Search ............ 156/345.31, 156/345.32; 118/719; 414/935, 939
See application file for complete search history.

(56) References Cited

U.S. PATENT DOCUMENTS

| 4,981,408 | A | * | 1/1991 | Hughes et al. | ............... | 414/217 |
| 5,091,217 | A | * | 2/1992 | Hey et al. | ................... | 118/719 |
| 5,417,537 | A | * | 5/1995 | Miller | ........................ | 414/217 |
| 5,686,834 | A | | 11/1997 | Okudaira et al. | | |
| 6,533,531 | B1 | * | 3/2003 | Nguyen et al. | ........... | 414/751.1 |
| 6,863,458 | B2 | * | 3/2005 | Konishi et al. | .............. | 400/611 |
| 2001/0050224 | A1 | * | 12/2001 | Ishikawa et al. | ........ | 204/298.16 |

FOREIGN PATENT DOCUMENTS

EP 648698 4/1995

(Continued)

*Primary Examiner*—Karla Moore
(74) *Attorney, Agent, or Firm*—Oblon, Spivak, McClelland, Maier & Neustadt, L.L.P.

(57) ABSTRACT

A main carrying device forming a part of a processing system, comprising a casing (40) forming a main carrying chamber (44) having vacuum atmosphere, the casing (40) further comprising a plurality of transfer ports (52A, 52B) for transferring the processed body (W) between the carrying chamber 44 and the outside, a mobile body (58) is slidably installed on a guide rail (48) horizontally installed in the carrying chamber (44), a linear motor mechanism (54, 62) for moving the mobile body (58) along the guide rail (48) is installed, a holding body (64) for holding the processed body (W) is liftably connected to the mobile body (58) through a support member (66), and a lifting mechanism (74) for lifting the support member (66) relative to the mobile body (58) is installed in the casing (40) at a position corresponding to the transfer ports (52A, 52B).

13 Claims, 12 Drawing Sheets

FOREIGN PATENT DOCUMENTS

| | | |
|---|---|---|
| EP | 1146548 | 10/2001 |
| EP | 1195795 | 4/2002 |
| JP | 38636/1991 | 4/1991 |
| JP | 4-137961 | 12/1992 |
| JP | 6-100164 | 4/1994 |
| JP | 6-179524 | 6/1994 |
| JP | 7-108159 | 4/1995 |
| JP | 8-8324 | 1/1996 |
| JP | 2000-323548 | 11/2000 |
| WO | WO 2004/026096 A2 | 4/2004 |
| WO | WO 2004/032177 A2 | 4/2004 |
| WO | WO 2004/032178 A2 | 4/2004 |

* cited by examiner

PROCESSED BODY CARRYING DEVICE, AND PROCESSING SYSTEM WITH CARRYING DEVICE

FIELD OF THE INVENTION

The present invention relates to a transfer mechanism for transferring an object to be processed such as a semiconductor wafer, and a processing system including such transfer mechanism, for performing, e.g., a film forming process on the object.

BACKGROUND OF THE INVENTION

Conventionally in a manufacturing process of a semiconductor device, an object to be processed such as a semiconductor wafer is carried into a vacuum processing apparatus and then a predetermined process is executed on the semiconductor wafer under a depressurized atmosphere. In general, plural kinds of processes, e.g., film formation, etching, heating, and the like, are performed on the wafer in different processing apparatuses to complete the semiconductor device.

In such case, if the wafer is transferred through a plurality of processing apparatuses separately installed from each other, a processing chamber (or a load-lock chamber) of each processing apparatus is exposed to the atmosphere whenever the wafer is carried into and out of each processing apparatus. By this, a considerable amount of time is required for evacuating the processing chambers (load-lock chambers), leading to a deterioration in throughput. Further, there may be a process in which a formation of a natural oxide film or moisture on a surface of the wafer should be avoided depending on the type of the process, e.g., when performing a series of film forming processes.

For such reason, there has been developed a so-called cluster type processing system in which a polygonal common vessel for defining a common transfer chamber under a vacuum state is provided in a center thereof; and a plurality of vacuum processing apparatuses are disposed around and connected with the common vessel in a radial shape. In this processing system, a plurality of processes can be performed on the wafer by transferring the wafer through the plural processing apparatuses without exposing a processing chamber of each processing apparatus to the atmosphere. Through a plurality of cluster type processing systems, a large quantity of wafers are transferred at a low speed by an automated guided vehicle (AGV or RGV) or the like.

Nowadays, there are ever-increasing demands for high density, high integration and small quantity batch production of many different kinds of the semiconductor devices. Moreover, it is also required to further improve a processing efficiency and increase the kinds of the processes. Therefore, it becomes necessary to connect a larger number (e.g., five or more) of processing apparatuses than conventionally required (e.g., three), to the common vessel in the cluster system. Further, additional processing apparatuses may be required to be installed at an already prepared cluster type processing system.

In such a case, there can be conceived a scheme of increasing a size of the polygonal common vessel of the cluster type processing system to connect more processing apparatuses around a periphery thereof, or connecting a plurality of common vessels to each other. However, an enlargement of the size of the common vessel requires a large-scale increase in strength (thickness) of a ceiling and a bottom wall of the vessel since an inner space of the common vessel is in a vacuum state, which, as a result, proves to be unrealistic. Further, in case the plurality of processing apparatuses are connected to the polygonal common vessel in the radial shape, there are left lots of dead spaces between the processing apparatuses, resulting in a poor utilization of space.

To address such problems, there have been proposed processing systems such as disclosed in Japanese Patent Laid-open Publication Nos. 4-288812, 6-349931, 8-119409 and 2001-2241. In such processing systems, an elongated common vessel of a rectangular shape is provided, and a plurality of processing apparatuses are connected to longer sidewalls of the common vessel. Further, a moving part having a rotatable, flexible and compressible/extensible transfer arm for mounting thereon a wafer is installed in the common vessel to be rectilinearly movable in a longitudinal direction of the common vessel.

Such processing systems are superior, in view of efficiency in space utilization, to the aforementioned processing system which includes the processing apparatuses radially disposed around the common vessel, but has less freedom in the installation of the additional processing apparatuses therein. For instance, in case one or more processing apparatuses need to be added to a processing system already installed, it is difficult to quickly respond to meet such need.

Furthermore, the moving part is moved in the common vessel in the longitudinal direction thereof to transfer the wafer. However, it is not preferable to install an elevation mechanism for loading and unloading the wafer in the transfer arm of the moving part and to connect a cable for supplying a driving power (to the transfer arm or the elevation mechanism) to the moving part. This is because there may be produced particles due to sliding motion of the elevation mechanism and impurities to be introduced from the cable or the like, which eventually will lead to complicating the structure and the scaling up of the moving part.

SUMMARY OF THE INVENTION

It is, therefore, a primary object of the present invention to provide a transfer mechanism of an object to be processed and a processing system having an improved efficiency in space utilization which are designed to facilitate simplification and miniaturization of a moving part moving along with the object.

Further, it is another object of the present invention to provide a processing system capable of readily increasing and decreasing the number of processing apparatuses installed therein.

In accordance with a preferred embodiment of the present invention, there is provided a transfer mechanism for transferring an object to be processed, comprising: a casing for defining a transfer chamber under a vacuum state, the casing having a transfer port for transferring the object between the transfer chamber and an outside thereof; a guide rail substantially horizontally installed in the transfer chamber; a moving body movably installed on the guide rail; a horizontally driving unit for moving the moving body along the guide rail; an elevation supporting structure including a holding body for holding the object and a supporting member for vertically movably connecting the holding body to the moving body; and an elevation mechanism disposed at a position corresponding to the transfer port of the casing, for raising and lowering the supporting member of the elevation supporting structure with respect to the moving body.

In such a configuration, it is not necessary to install an elevation mechanism in the moving body or the elevation supporting structure, both included in the moving part which moves along with the object, thereby contributing to simplification and miniaturization of the moving part.

In such a case, a horizontally transferring unit for moving the object only in a horizontal direction through the transfer port may be installed at the outside of the casing; and the elevation mechanism may position the object held in the holding body to a height corresponding to the horizontally transferring unit.

The moving body may include a stopper for restricting the lowest position of the supporting member and may be formed to move while the supporting member is at the lowest position thereof.

The elevation mechanism may include: a push rod extending through a bottom portion of the casing and making a contact with the supporting member; a vertically driving unit disposed at the outside of the casing, for raising and lowering the push rod; and a sealing unit for airtightly sealing a gap between the push rod and the casing.

Preferably, the transfer mechanism further comprises: a position detecting linear scale installed in at least one of the moving body and the elevation supporting structure and extending in a moving direction of the moving body; and a plurality of position detecting sensors installed at a height corresponding to the linear scale on an inner surface of the casing, the position detecting sensors being disposed in the moving direction of the moving body such that a distance between two neighboring position detecting sensors is shorter than a length of the linear scale. Under such configuration, there is no need for connecting wirings from the position detecting sensors to the moving body since the position detecting sensors are located at the inner surface of the casing. Further, heat generated from the position detecting sensors is transmitted to the casing to thereby prevent the overheating thereof. The horizontally driving unit may be a linear motor mechanism including armature coils installed in the casing in the moving direction of the moving body and a field magnet installed in the moving body; and a separation wall for airtightly separating the armature coil from the inside of the transfer chamber may be installed in the casing. Such configuration makes it unnecessary to connect a cable for supplying a driving power to the moving body. Further, gas from a molded member generally used for the armature coil can be prevented from flowing into the transfer chamber by the separation wall.

Preferably, the transfer mechanism further comprises a magnetic levitation device or gas jetting levitation device for levitating the moving body from the guide rail. By this, generation of particles due to a sliding motion of the moving body on the guide rail can be prevented.

A partition wall for dividing the transfer chamber into an upper portion and a lower portion may be installed in the casing; the holding body of the elevation supporting structure may be disposed in the upper portion of the transfer chamber while the moving body is disposed in the lower portion of the transfer chamber; the partition wall may have a slit for allowing the supporting member of the elevation supporting structure to move therethrough; and the transfer mechanism may further include: a gas supplying system for supplying an inactive gas to the upper portion of the transfer chamber, and a gas exhausting system for evacuating the gas from the lower portion of the transfer chamber. Under such configuration, the particles produced by the sliding motion of the moving body in the lower portion of the transfer chamber can be suppressed from being attached to the object held by the holding body in the upper portion of the transfer chamber. Further, by flowing the inactive gas, the partial pressure of impurities in the transfer chamber generated during the evacuation can be lowered. The inactive gas herein includes a $N_2$ gas.

In accordance with another preferred embodiment of the present invention, there is provided a transfer mechanism for transferring an object to be processed, comprising: a casing for defining a transfer chamber under a vacuum state, the casing having a transfer port for transferring the object between the transfer chamber and an outside thereof; a guide rail substantially horizontally installed in the transfer chamber; a moving part movably installed on the guide rail, the moving part including a holding body for holding the object; a horizontally driving unit for moving the moving part along the guide rail; a position detecting linear scale installed in the moving part and extending in a moving direction of the moving part; and a plurality of position detecting sensors installed at a height corresponding to the linear scale, on an inner surface of the casing, the position detecting sensors being disposed in the moving direction of the moving part such that a distance between the two neighboring position detecting sensors is shorter than a length of the linear scale.

In accordance with still another embodiment of the present invention, there is provided a processing system comprising: (a) a main transfer mechanism including: a casing for defining a main transfer mechanism under a vacuum state, the casing having a plurality of transfer ports; a guide rail substantially horizontally installed in the transfer chamber; a moving body movably installed on the guide rail; a horizontally driving unit for moving the moving body along the guide rail; an elevation supporting structure having a holding body for holding an object to be processed and a supporting member for vertically movably connecting the holding body to the moving body; and an elevation mechanism for raising and lowering the supporting member of the elevation supporting structure with respect to the moving body; (b) an auxiliary transfer mechanism including a casing for defining an auxiliary transfer chamber under a vacuum state which selectively communicates with the main transfer chamber; and an auxiliary transfer unit installed in the auxiliary transfer chamber; (c) a load-lock mechanism including a casing for defining a load-lock chamber which selectively communicates with the auxiliary transfer chamber and is selectively evacuated; (d) an entrance transfer mechanism including a casing for defining an entrance transfer chamber under an atmospheric state which selectively communicates with the load-lock chamber; and an entrance transfer unit installed in the entrance transfer chamber; (e) a cassette station connected to the entrance transfer chamber, for mounting therein a cassette container which accommodates a plurality of objects to be processed; (f) a plurality of individual transfer mechanisms installed to correspond to the respective transfer ports of the main transfer mechanism, each of the individual transfer mechanisms including a casing for defining an individual transfer chamber under a vacuum state which selectively communicates with the main transfer chamber via the corresponding transfer port; and an individual transfer unit installed in the individual transfer chamber; and (g) a plurality of processing apparatuses installed to correspond to the respective individual transfer mechanisms, each of the processing apparatuses including a casing for defining a vacuum processing chamber which selectively communicates with the corresponding individual transfer chamber, and performing a predetermined process on the object therein.

By configuring as the above, the plurality of processing apparatuses are connected to the casing of the main transfer mechanism (via the respective individual transfer chambers) in the moving direction of the moving body to be spaced apart from each other, thereby obtaining the processing system having a good space utilization efficiency even though there are a large number of the processing apparatuses. Further, the object can be transferred at a higher speed in the main transfer chamber, compared to the conventional processing system, even when the transferring distance in a horizontal direction becomes longer. Furthermore, by utilizing the elevation supporting structure and the elevation mechanism of the main transfer mechanism, a horizontally transferring unit for moving the object only in a horizontal direction can be employed as the individual transferring unit.

The casing of the main transfer mechanism may include at least one of a plurality of casing segments connectable with each other, each of the casing segments having at least one of the transfer ports; and the guide rail may include at least one of a plurality of guide rail segments connectable with each other. Under such configuration, the casing segment and the guide rail segment can be connected with other casing segments and other guide rail segments, respectively, as many as required, which facilitates simplification of the construction of the main transferring mechanism which includes the main transferring chamber having a desired length. Accordingly, the number of the processing apparatuses connected to the main transferring mechanism (via the respective individual transferring chambers) can be readily increased or decreased.

DETAILED DESCRIPTION OF THE PREFERRED EMBODIMENT

Hereinafter, a preferred embodiment of a transfer mechanism of an object to be processed and a processing system in accordance with the present invention will be described in detail with reference to the accompanying drawings.

Figure 1:
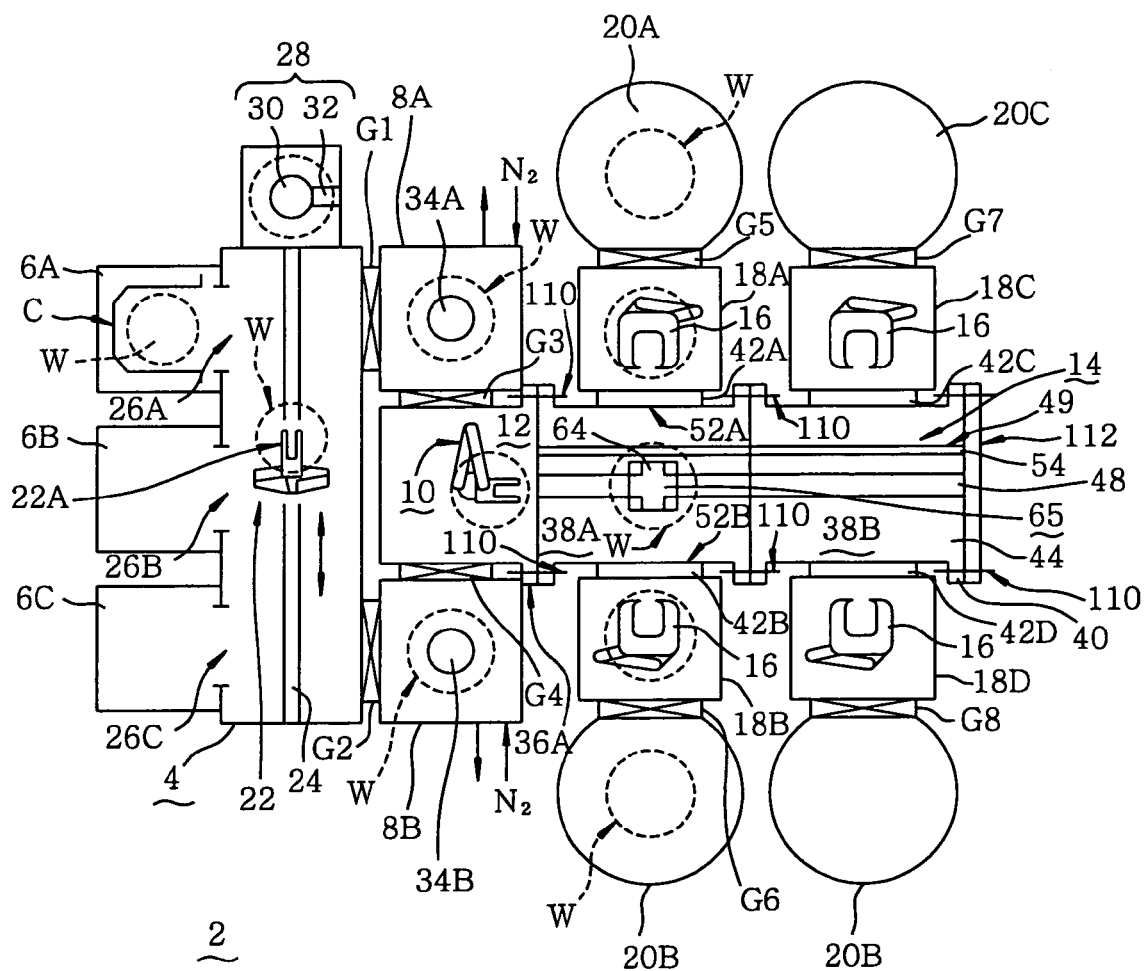
FIG. 1 offers a horizontal sectional view for schematically showing a preferred embodiment of a processing system in accordance with the present invention.

Referring to FIG. 1, a processing system 2 is provided with a main transfer mechanism 14, an auxiliary transfer mechanism 12, two load-lock mechanisms 8A and 8B, an entrance transfer mechanism 4, three cassette stations 6A, 6B and 6C, four individual transfer mechanisms 18A to 18D and four processing apparatuses 20A to 20D.

The main transfer mechanism 14 includes a casing 40 for defining a main transfer chamber 44 under a vacuum state, the casing 40 having two sets of transfer ports 52A, 52B and 52A, 52B. The auxiliary transfer mechanism 12 includes a casing for defining an auxiliary transfer chamber under a vacuum state which can communicate with the main transfer chamber 44; and an auxiliary transfer unit 10 installed in the transfer chamber thereof. Each of the load-lock mechanisms 8A, 8B includes a vessel (casing) for defining a load-lock chamber which can communicate with the transfer chamber of the auxiliary transfer mechanism 12 and be evacuated to a vacuum state. The entrance transfer mechanism 4 includes a casing for defining an entrance transfer chamber in an atmospheric state, which can communicate with the load-lock chambers of the load-lock mechanisms 8A, 8B; and an entrance transfer unit 22 installed in the transfer chamber thereof. The cassette stations 6A to 6C are connected to the entrance transfer mechanism 4, in communication with the transfer chamber thereof, and have therein respective cassette containers to be mounted, each capable of accommodating a plurality of semiconductor wafers W as objects to be processed.

The individual transfer mechanisms 18A to 18D are installed to correspond to the respective transfer ports 52A, 52B, 52A, 52B of the main transfer mechanism 14. The individual transfer mechanisms 18A to 18D include respective casings for defining individual transfer chambers under a vacuum state which can communicate with the main transfer chamber 44 via the corresponding transfer ports 52A, 52B, 52A, 52B, respectively; and individual transfer units 16 provided in the respective transfer chambers thereof.

The processing apparatuses 20A to 20D are installed to correspond to the individual transfer mechanisms 18A to 18D, respectively. The processing apparatuses include respective vessels (casings) for defining vacuum processing chambers which can communicate with the corresponding individual transfer mechanisms 18A to 18D, and perform predetermined processes on the wafer in the respective processing chambers thereof. The processing apparatuses 20A to 20D may appropriately perform, e.g., film formation, preheating, cleaning, plasma etching, diffusion of oxidation, cooling, and the like.

Specifically, the casing of the entrance transfer mechanism 4 has an elongated box shape. The entrance transfer unit 22 has a pick 22A for supporting the wafer W and a multi-joint arm capable of rotating, being flexible and compressible/extensible and vertically moving. Instead of the single pick 22A, a plurality of picks 22A, which are separately controllable, may be provided in the entrance transfer unit 22. The entrance transfer unit 22 is configured such that the arm having the pick 22A can be moved in a longitudinal direction of the casing along a guide rail 24 by a horizontally moving unit such as a linear motor.

Formed on one of longer sidewalls of the entrance transfer mechanism 4 are loading/unloading ports 26A to 26C which are connected to the cassette stations 6A to 6C, respectively. FIG. 1 shows a state wherein only one cassette station 6A has the cassette container C mounted therein. There may be installed at the loading/unloading ports 26A to 26C respective doors which are opened while loading and unloading the wafer W.

Disposed at one end portion of the entrance transfer mechanism 4 is an alignment mechanism 28 provided with a rotatable table 30 which rotates with the wafer W mounted thereon; and an optical line sensor 32 for detecting an edge of the wafer W. The alignment mechanism 28 detects a position of the center of the wafer W and an orientation flat or a notch to perform an aligning process thereof. The inner space of the transfer chamber of the entrance transfer mechanism 4 including the alignment mechanism 28 is maintained at an atmospheric state with air or a $N_2$ gas.

The load-lock mechanisms 8A, 8B are connected to both end portions of the other longer sidewall of the entrance transfer mechanism 4 via gate valves G1, G2, respectively. Installed in the load-lock mechanisms 8A, 8B are vertically movable mounting tables 34A, 34B, respectively, for temporarily supporting the wafer W. The load-lock mechanisms 8A, 8B may be fed with and be exhausted of an inactive gas, e.g., $N_2$ gas, whereby the load-lock mechanisms 8A, 8B can be controlled to be in the vacuum state or in the atmospheric state, as required.

There are disposed between the load-lock mechanisms 8A, 8B the auxiliary transfer mechanism 12 connected thereto via gate valves G3, G4, respectively. The auxiliary transfer unit 10 provided in the transfer chamber of the auxiliary transfer mechanism 12 has a rotatable, flexible and compressible/extensible multi-joint arm. The auxiliary transfer mechanism 12 can transfer the wafer W between the load-lock mechanisms 8A, 8B by the auxiliary transfer unit 10. The auxiliary transfer unit 10 may have a plurality of picks separately controllable. One end of the casing of the auxiliary transfer mechanism 12 is opened, and a connection flange 36A is formed at a periphery of the opening.

Connected to the opening of the auxiliary transfer mechanism 12 is the main transfer mechanism 14. The main part of the main transfer mechanism 14 includes at least one of a plurality of transfer mechanism units which can be connected with each other by using bolts or the like. In other words, the main part of the main transfer mechanism 14 is of a structure wherein an arbitrary number of modulated transfer chamber units can be connected in series. FIG. 1 illustrates the main transfer mechanism 14 including two transfer mechanism units 38A, 38B connected in series. Horizontally installed in the main transfer chamber 44 of the main transfer mechanism 14 is a guide rail 48 which extends in a direction along which the transfer mechanism units 38A, 38B are connected. Arranged on the guide rail 48 is a moving part 65 which is moved by a linear motor mechanism 49 serving as a horizontally driving mechanism. Each of the two sets of transfer ports 52A, 52B, 52A, 52B formed in the casing 40 of the main transfer mechanism 14 is assigned to a corresponding one of the transfer mechanism units 38A, 38B. The individual transfer mechanisms 18A to 18D are connected to the transfer ports 52A, 52B, 52A, 52B of the main transfer mechanism 14 via short connection tubes 42A to 42D, respectively. Further, the individual transfer mechanisms 18A to 18D are connected to the processing apparatuses 20A to 20D via gate valves G5 to G8, respectively. The respective individual transfer units 16 of the individual transfer mechanisms 18A to 18D serve as horizontally transferring units for moving the wafer W along horizontal direction only.

Referring to FIGS. 2 to 7, the transfer mechanism units 38A, 38B included in the main transfer mechanism 14 will be described in detail hereinafter. Since the transfer mechanism units 38A, 38B have substantially an identical configuration to each other, only one transfer mechanism unit 38A will be explained.

Figure 2:
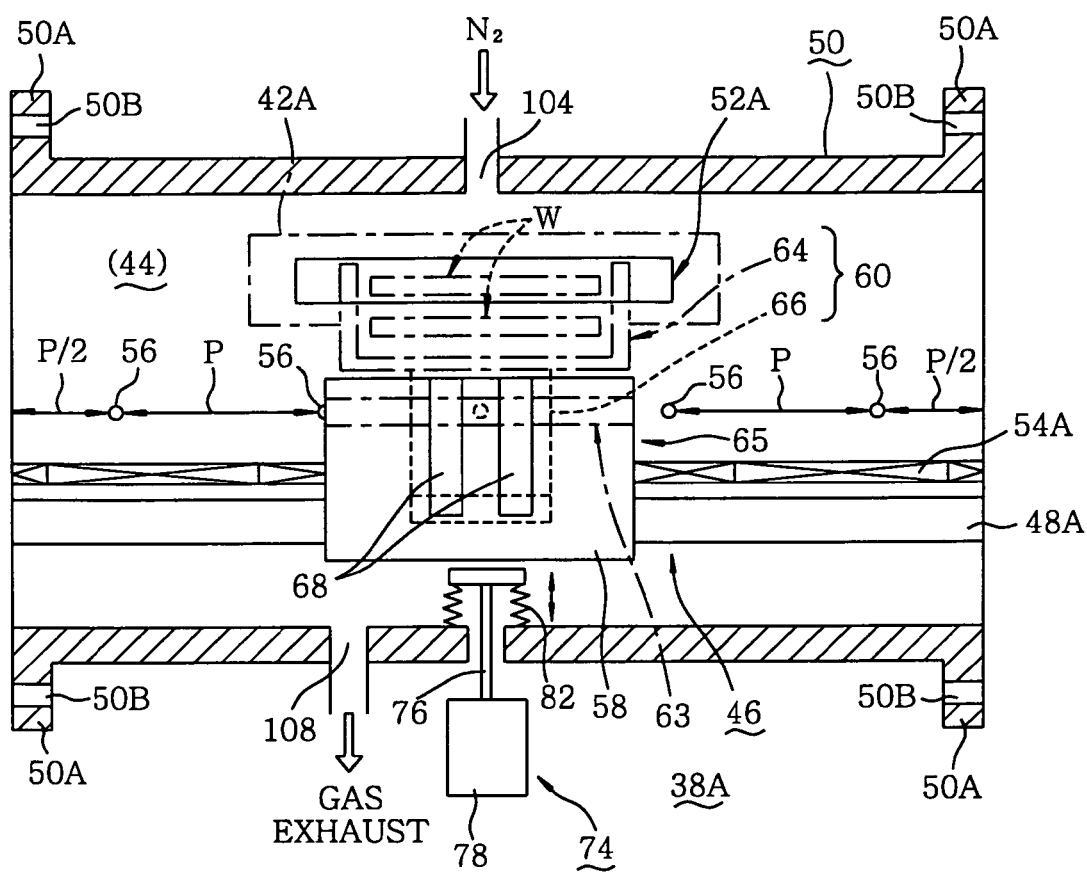
FIG. 2 gives an enlarged vertical sectional view of one of transfer modules included in a main transfer mechanism in the processing system of FIG. 1.
Figure 3:
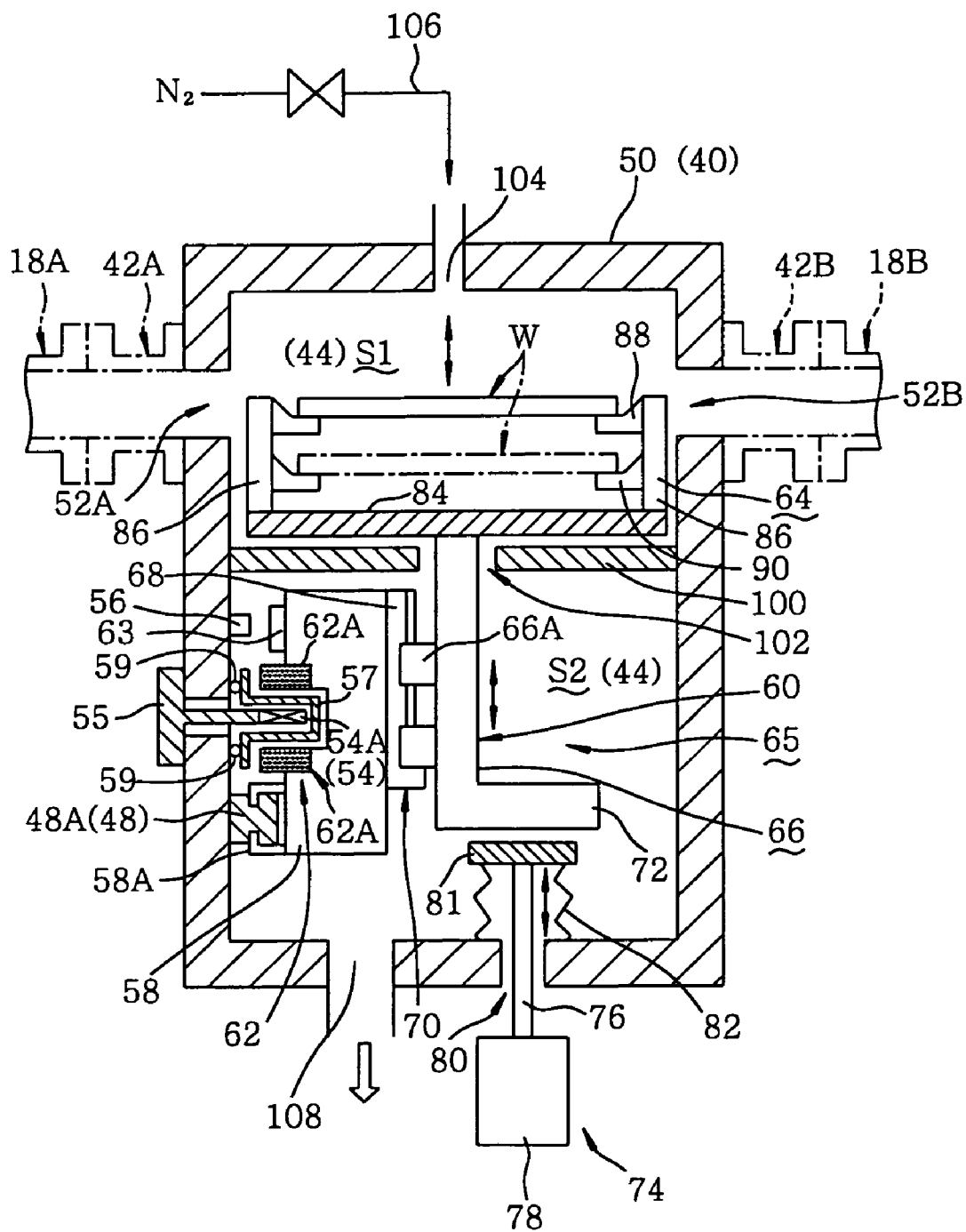
FIG. 3 provides a transverse sectional view of the transfer module shown in FIG. 2.

As illustrated in FIGS. 2 and 3, the transfer mechanism unit 38A includes a casing segment 50 made of aluminum as a part of the casing 40. The casing segment 50 has a box shape whose both ends are opened and the cross sectional shape thereof is rectangular. Hereinafter, the direction of a longitudinal axis (horizontal direction in FIG. 2) of the casing segment 50 (casing 40) will be referred to as a longitudinal axis direction for simplicity. The longitudinal axis direction coincides with a moving direction of the moving part 65 along the guide rail 48.

Formed in the peripheral portions of the openings of both end portions of the casing segment 50 are connection flanges 50A, each having a number of bolt holes 50B. In such a configuration, the casing segments 50 can be connected with each other by using bolts. A sealing member such as an O-ring may be interposed between casing segments 50 connected with each other, in order to ensure an airtightness therebetween. Formed in upper portions of both sidewalls of the casing segment 50 are the above-described transfer ports 52A, 52B of a rectangular shape.

Fixedly installed at a lower portion of a designated sidewall of the casing segment 50 is a guide rail segment 48A horizontally extending in the longitudinal axis direction. A plurality of guide rail segments 48A may be connected in series to form a longer guide rail 48 (in FIG. 1).

An armature coil segments 54A as a part of the linear motor mechanism 49 (FIG. 1) is fixedly installed at the designated sidewall of the casing segment 50 via corresponding installation member 55 (FIG. 3). A plurality of armature coil segments 54A are disposed above the guide rail segment 48A along the sidewall in the longitudinal axis direction to be spaced apart from each other at a certain distance. An armature coil 54 (FIG. 1) can be formed by electrically connecting the armature coil segments 54A.

Furthermore, a plurality of position detecting sensors 56 are linearly disposed at the designated side wall of the casing segment 50 in the longitudinal axis direction such that neighboring position detecting sensors 56 are spaced from each other at a specific distance P. The position detecting sensors 56 can employ a detecting method such as an optical method or a magnetic method, the selection thereof being determined by a relationship with a linear scale 63 to be described later. The position detecting sensors 56 located at both end portions of the casing segment 50 are disposed away from the ends of the casing by a half of the distance P, respectively, in order to maintain the distance P from the position detecting sensors 56 of other neighboring casing segments 50 connected thereto.

The moving part 65 moving along the guide rail 48 includes a moving body 58 installed on the guide rail 48 and an elevation supporting structure 60 installed on the moving body 58. As shown in FIG. 3, provided at one side of the moving body 58 is a claw 58A engaged with the guide rail 48, with which the moving body 58 is slidably installed on the guide rail 48. Disposed on the same side of the moving body 58 is a field magnet 62 magnetically interacting with the armature coil segment 54A. The field magnet 62 is made of a pair of permanent magnets 62A arranged above and below the armature coil segment 54A disposed therebetween. There exists a narrow space between the armature coil segment 54A and the field magnet 62A. The field magnet 62 also is a part of the linear motor mechanism 49.

The armature coil segment 54A is covered with a separation wall 57 which is bent to extend between the armature coil segment 54A and the field magnet 62. A base portion of the separation wall 57 is airtightly fixed on an inner wall of the casing segment 50 via a sealing member 59 such as an O-ring. The separation wall 57 is formed of a non-magnetic material, e.g., non-magnetic stainless steel. Under such configuration, the armature coil segment 54A is placed in a state of atmosphere hermetically separated from the field magnets 62, thereby preventing a gas generated from a molded member generally used for the armature coil 54 from being introduced into the main transfer chamber 44 (refer to FIG. 1).

Figure 4:
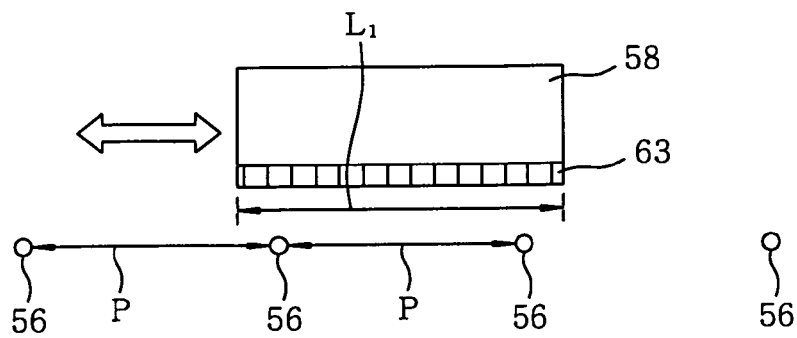
FIG. 4 describes a positional relationship between the linear scale and position detecting sensors in the main transfer mechanism.

Provided on one side surface of the moving body 58 is the linear scale 63 facing the position detecting sensor 56. As shown in FIG. 4, the distance P between neighboring position detecting sensors 56 is set to be shorter than a length L1 of the linear scale 63, whereby the position of the moving body 58 can be detected by the position detecting sensors 56 wherever the moving body 58 is stopped. Further, as long as the distance between the neighboring position detecting sensors 56 is set to be shorter than the length of the linear scale 63, the position detecting sensors 56 need not be equi-distanced.

The elevation supporting structure 60 includes a holding body 64 for holding the wafer W and a supporting member 66 for vertically movably connecting the holding body 64 to the moving body 58. The supporting member 66 is slidably installed via claws 66A on a vertical guide rail 68 provided at the other side of the moving body 58. Disposed at a lower end portion of the vertical guide rail 68 is a stopper 70 for restricting the lowest position of the supporting member 66. The moving part 65 (the moving body 58) moves while the supporting member 66 is at the lowest position thereof. Installed at a lower end portion of the supporting member 66 is a contact portion 72 horizontally extending in a side direction.

At the position in the longitudinal axis direction corresponding to the transfer ports 52A, 52B (FIG. 2), an elevation mechanism 74 for raising and lowering the supporting member 66 against the moving body 58 is provided at a bottom portion of the casing segment 50. The elevation mechanism 74 has a push rod 76 vertically moving through the bottom portion of the casing segment 50 and an actuator 78 serving as a vertically driving unit, for moving up and down the push rod 76. Formed on a bottom wall of the casing segment 50 is a through-hole 80 for movement of the push rod 76. Further, the actuator 78 is disposed outside the casing segment 50.

There is mounted at a leading end portion of the push rod 76 a back plate 81 which makes a contact with the contact portion 72 of the supporting member 66. A metallic bellows 82 functioning as a sealing unit connects the back plate 81 and a peripheral portion of the through-hole 80 of the casing segment 50. The sealing unit may have various shapes as long as it can airtightly seal a gap between the push rod 76 and the casing segment 50. For instance, the sealing unit may be a sealing member such as an O-ring which is installed between the push rod 76 and the through-hole 80.

The elevation mechanism 74 is designed to position the wafer W held by the holding body 64 to a height corresponding to the individual transfer unit 16. In the present embodiment, the holding body 64 is configured to support as many as two wafers disposed above and below, as will be described below. In order to transfer each wafer W between the holding body 64 and the individual transfer unit 16, the holding body 64 needs to be moved to two levels in vertical height direction. Therefore, the positioning elevation mechanism 74 may have to position the holding body 64 to four levels in vertical height direction (besides the lowest position) to perform the mounting and transferring of the wafer W between the holding body 64 and the individual transfer mechanism 16.

Figure 5:
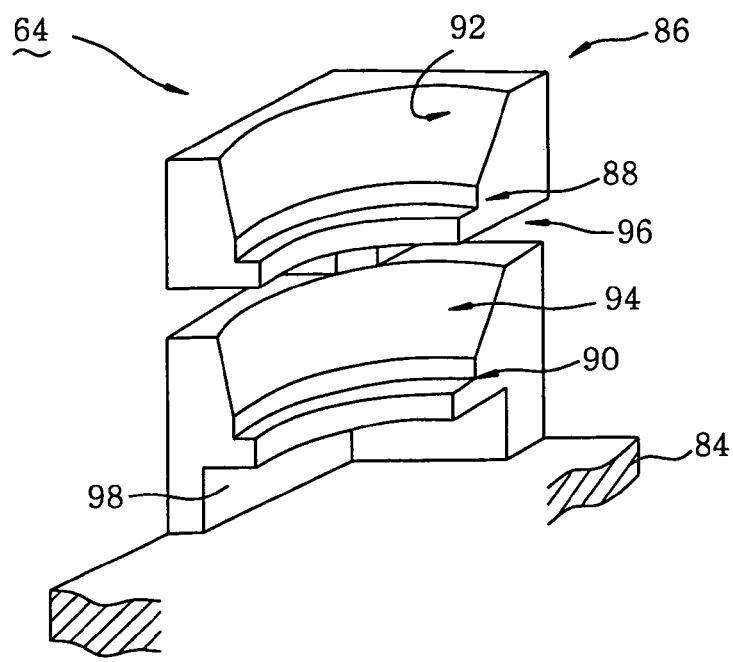
FIG. 5 illustrates a part of a holding body for holding thereon an object to be processed in the main transfer mechanism.
Figure 6:
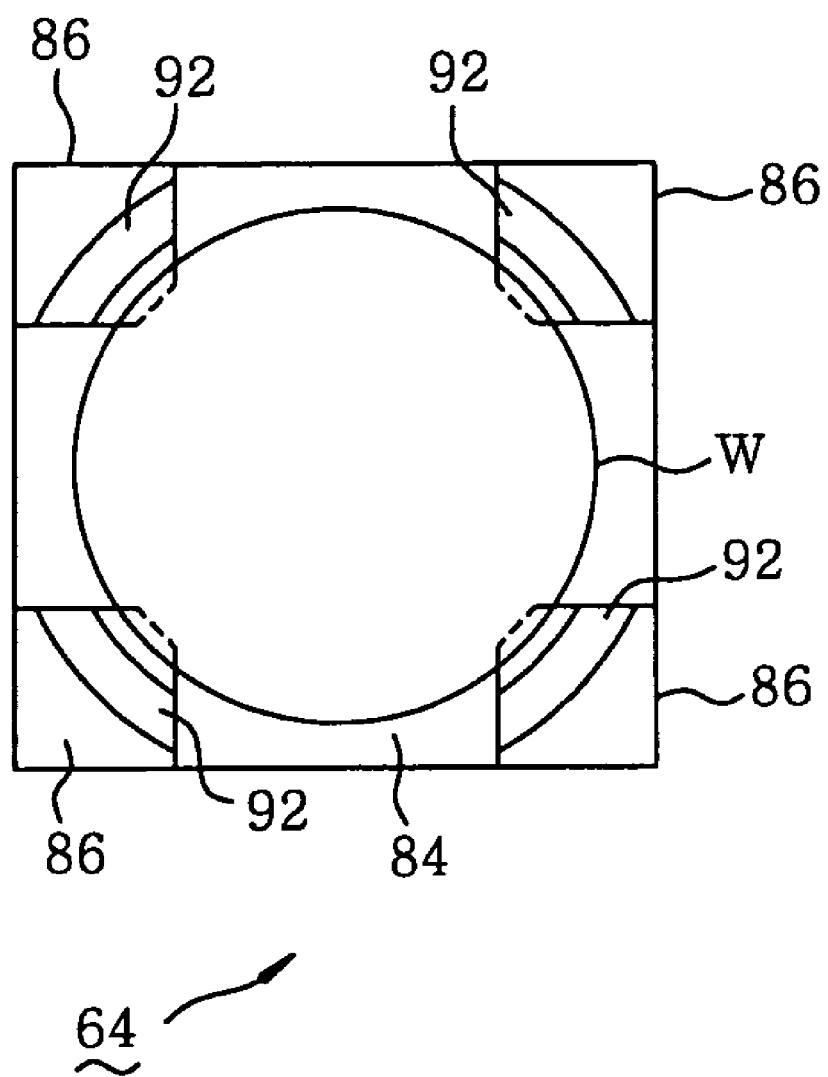
FIG. 6 offers a top view of the whole holding body of FIG. 5.

As shown in FIGS. 5 and 6, the holding body 64 is provided with a mounting plate 84 and four support columns 86 installed on the mounting plate 84. The support columns 86 are disposed at four corners of the square mounting table 84, respectively. The support columns 86 are of a same shape, and an enlarged view of one of the support columns 86 is illustrated in FIG. 5. Formed in an inner side of each support column 86 are upper and lower stepped portions 88, 90 (shown in FIG. 3 also) spaced apart from each other. Each of the stepped portions 88, 90 is of an arc shape having substantially the same curvature as a periphery of the wafer W. A bottom surface of the peripheral portion of each wafer W is mounted on the corresponding stepped portion 88 or 90 of each support column 86, so that each of the two wafers W can be supported at four spots.

Formed on the stepped portions 88, 90 are conically tapered surfaces 92, 94, each widening gradually toward upper ends. By configuring as the above, the wafer W slips down on the corresponding tapered surface 92, 94 to be mounted on the corresponding stepped portion 88, 90. Between the upper stepped portion 88 and the lower tapered surface 94, slits 96 are formed on both sides of the support column 86. The respective slits 96 of the four support columns 86 allow the wafer W to be mounted on the stepped portion 90 therethrough without being interfered with or colliding against the support column 86. Prepared under the lower stepped portion 90 is a clearance space 98 through which the pick of the individual transfer unit 16 is withdrawn.

Figure 3A:
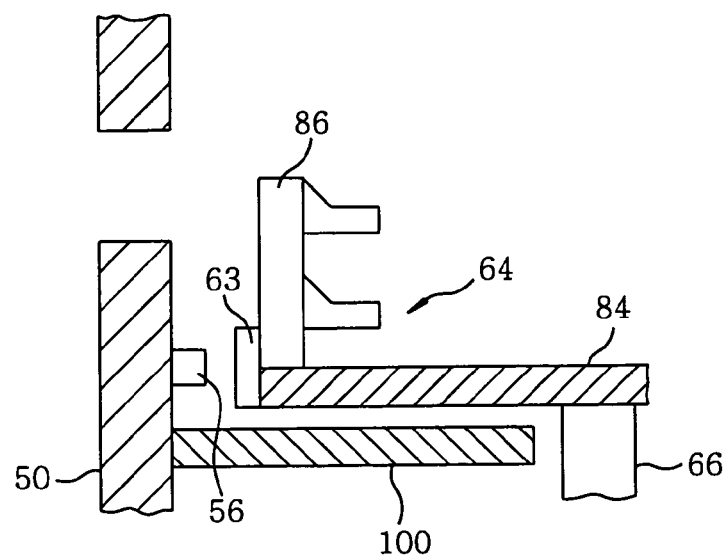
FIG. 3A represents an enlarged sectional view of a linear scale disposed on a side surface of a holding body.
Figure 3B:
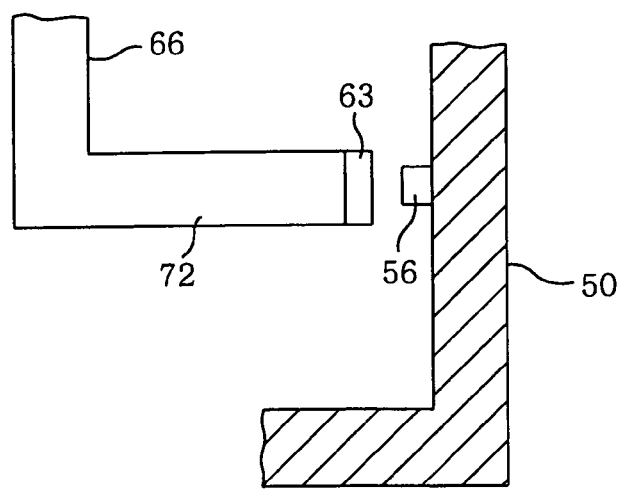
FIG. 3B offers an enlarged sectional view of the linear scale disposed on a side surface of a contact portion of a supporting member.

It should be noted that the location of the linear scale 63 is not limited to the specific side of the moving body 58 as shown in FIG. 3. For instance, the linear scale 63 may be located on a side surface of the holding body 64, as illustrated in FIG. 3A, or on a side surface of the contact portion 72 of the supporting member 66, as in FIG. 3B. In such cases, the position detecting sensors 56 should be installed at positions which may face the linear scale 63.

As shown in FIG. 3, there is installed a horizontal partition wall 100 for dividing the main transfer chamber 44 into an upper space S1 and a lower space S2. The holding body 64 of the elevation supporting structure 65 is disposed in the upper space S1 and the moving body 58 is disposed in the lower space S2. Furthermore, formed at the substantially center part of the horizontal partition wall 100 is a slit 102 extending in the longitudinal axis direction, for allowing a horizontal and vertical movement of the supporting member 66. The horizontal partition wall 100 is a segment which can be connected with other horizontal partition walls 100 in series and is installed in every transfer mechanism units 38A, 38B.

As illustrated in FIGS. 2 and 3, a gas introduction port 104 is provided at a ceiling wall of the casing segment 50. Further, there is provided a gas supplying system 106 for supplying a $N_2$ gas as an inactive gas to the upper space S1 through the gas introduction port 104. Formed at the bottom wall of the casing segment 50 is a gas exhaust port 108. A gas exhausting system (not shown) including a vacuum pump is provided to evacuate the lower space S2 through the gas exhaust port 108. The gas supplying system 106 and the gas exhausting system are basically assigned to each of the transfer mechanism units 38A, 38B.

With such arrangements, particles produced due to the sliding motion of the moving body 58 or the supporting member 66 in the lower space S2 can be prevented from being attached to the wafer W supported by the holding body 64 in the upper space S1. Furthermore, by allowing the inactive gas to flow through the main transfer chamber 44, the partial pressure of impurities (a gaseous component generated from the molded member and the like) therein, which is generated during the evacuation of the main transfer chamber 44, can be decreased.

As depicted in FIG. 1, the transfer mechanism units 38A, 38B having the above-described configuration are connected with each other by joining the connection flanges 50A formed at one ends thereof and fastening same by the bolts 110. The other end of the transfer mechanism unit 38A is connected with the auxiliary transfer mechanism 12 in a similar manner as the above. At the other end of the transfer mechanism unit 38B, a lid 112 is airtightly installed in the similar fashion as the above. In the present embodiment, it should be noted that a single moving part 65 is provided in the whole main transfer mechanism 14, not in every transfer mechanism units 38A, 38B.

Figure 7:
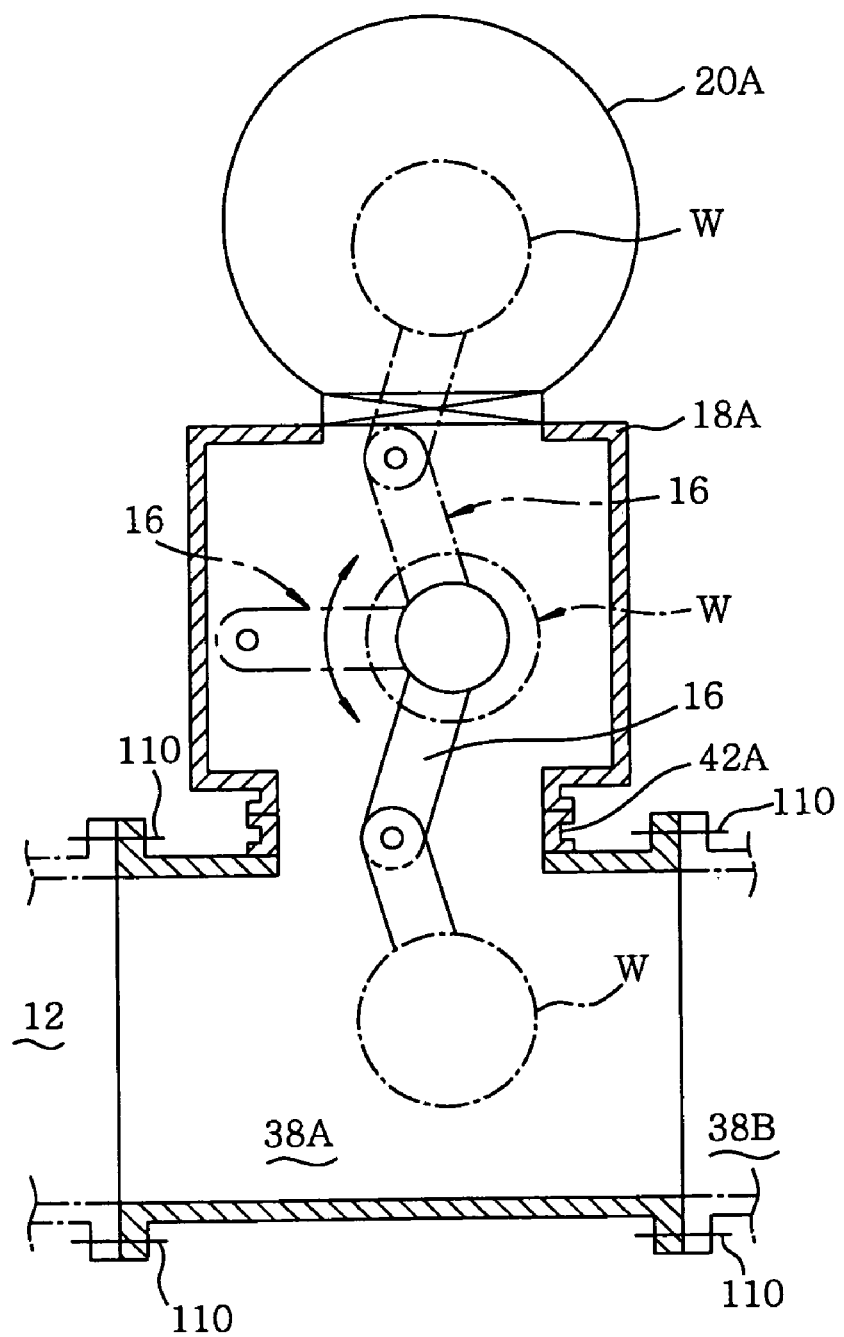
FIG. 7 depicts one of individual transfer mechanisms in the processing system of FIG. 1.

As shown in FIG. 7, installed in the respective transfer chambers of the individual transfer mechanisms 18A to 18D are the individual transfer units 16. Since the configurations of the individual transfer mechanisms 18A to 18D are identical, only one individual transfer mechanism 18A is illustrated in FIG. 7. Referring to FIG. 7, the individual transfer unit 16 has a multi-joint arm capable of rotating, being flexible and compressible/extensible. As described above, the main transfer mechanism 14 has a function of raising and lowering the wafer W by the elevation supporting structure 60 and the elevation mechanism 74 (FIG. 3). Therefore, the individual transfer unit 16 serving as the horizontally transferring unit for transferring the wafer W only in a horizontal direction can have the simpler structure.

Next, an operation of the processing system having the above configuration in accordance with the present embodiment will now be described.

First, an unprocessed semiconductor wafer W is carried out of, e.g., the cassette container C mounted in the cassette station 6A, as shown in FIG. 1, by using the entrance transfer unit 22 of the entrance transfer mechanism 4, and then transferred to the alignment mechanism 28 also by the entrance transfer unit 22. The alignment mechanism 28 performs an alignment process of the wafer W in accordance with a predetermined sequence.

After subjected to the alignment process, the wafer W is conveyed to the front of one of the load-lock mechanisms, e.g., the load-lock mechanism 8A, by the entrance transfer unit 22. After setting the inner space of the load-lock chamber of the load-lock mechanism 8A to be under the atmospheric pressure and then opening the gate valve G1, the wafer W is mounted on the mounting table 34A in the load-lock chamber. Then, the gate valve G1 is closed and the load-lock chamber of the load-lock mechanism 8A is exhausted to a vacuum state. Thereafter, the gate valve G3 is opened so that the load-lock chamber communicates with the auxiliary transfer mechanism 12 which is already been evacuated to be in a vacuum state.

Next, the wafer W is transferred to the main transfer chamber 44 of the main transfer mechanism 14 from the mounting table 34A of the load-lock mechanism 8A by using the auxiliary transfer unit 10 of the auxiliary transfer mechanism 12. The unprocessed wafer W transferred to the main transfer chamber 44 is mounted on the holding body 64 in FIG. 3. At this time, it is preferable for the wafer W to be loaded on the upper stepped portions 88 (FIG. 3) of the holding body 64 for protection against potential particles. If a processed wafer is loaded on the upper stepped portions 88, particles may fall down therefrom.

While holding the unprocessed wafer W on the holding body 64, the moving body 58 is driven to move by the linear motor mechanism 49 so that the moving part 65 is shifted to a position corresponding to the required processing apparatus 20A to 20D. For instance, when the wafer W is processed in the processing apparatus 20A, the moving part 65 is moved to a position corresponding to the transfer port 52A in front of the processing apparatus 20A.

The processed wafer W is taken out from the processing apparatus 20A and mounted on the lower stepped portions 90 (FIG. 3) of the holding body 64 by the individual transfer unit 16 (FIG. 7) of the individual transfer mechanism 18A. Thereafter, the wafer W loaded on the upper stepped portions 88 (FIG. 3) is unloaded therefrom and carried into the processing apparatus 20A by the identical individual transfer unit 16. By doing so, the processed wafer W and the unprocessed wafer W are exchanged. In this case, the holding body 64 is vertically moved to a height proper for performing the exchange by the elevation mechanism 74 since the individual transfer unit 16 has no elevator function.

Upon completion of a process in one processing apparatus as the above-described manner, the wafer W is transferred to a next processing apparatus to perform a subsequent processing thereon. After finishing all required processes on the wafer W, the wafer W is returned to its original position, i.e., the cassette container C in a reverse way to the above.

In the main transfer mechanism 14 in accordance with the present embodiment, the elevation supporting structure 60 of the moving part 65 is moved by the elevation mechanism 74, thereby raising and lowering the holding body 64 for supporting the wafer W. For such reason, the respective individual transfer units 16 of the individual transfer mechanisms 18A to 18D need not have any elevator function and, therefore, the structure of the individual transfer unit 16 can be simplified. Furthermore, the configuration corresponding to the elevation mechanism 74 can be omitted from the moving part which moves on the guide rail 48, facilitating the simplification and the miniaturization of the moving part 65 moving along with the wafer W to be processed. Moreover, the elevation supporting structure 60 itself can be made lighter, which in turn facilitates moving and stopping of the moving part 65.

Furthermore, the field magnet 62 made of the permanent magnets is installed on the moving body 58 while the armature coil 54 requiring a power supply is installed in the casing segment 50. Thus, it is not necessary to connect an electric power supplying cable for the armature coil to the moving part 65.

Meanwhile, there may be a case where one or more processing apparatuses need to be added to the processing system configured as shown in FIG. 1 to perform more processes on the wafer W.

Figure 8:
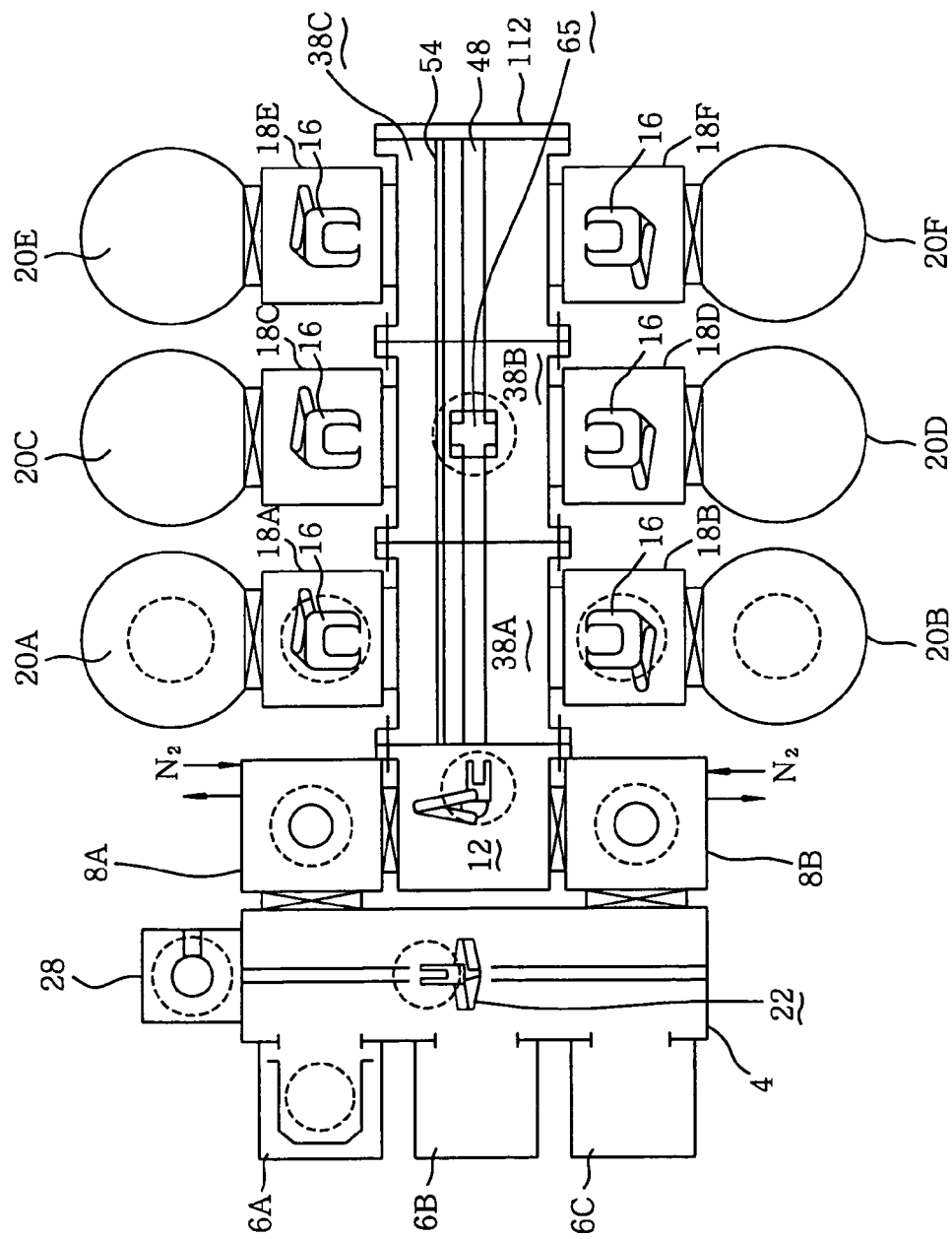
FIG. 8 shows a first modified example of the processing system of FIG. 1.

In such case, a new transfer mechanism unit 38C may be connected to the end portion of the transfer mechanism unit 38B with the lid 112 detached therefrom, as in a first modified example of the present embodiment shown in FIG. 8. Like reference numerals in FIG. 8 represent like parts. In this example, two processing apparatuses 20E, 20F are connected to the newly added transfer mechanism unit 38C via two individual transfer mechanisms 18E, 18F, respectively. There are included in the added transfer mechanism unit 38C the armature coil segment 54A and the guide rail segment 48A (FIG. 3) for extending the armature coil 54 and the guide rail 48, respectively.

By connecting a specific number of transfer mechanism units in series in the above-described manner, a required number of processing apparatuses can be easily added. Further, in the manufacturing stage before shipment of the processing system, the processing system can be readily assembled to have as many processing apparatuses as ordered.

Figure 9:
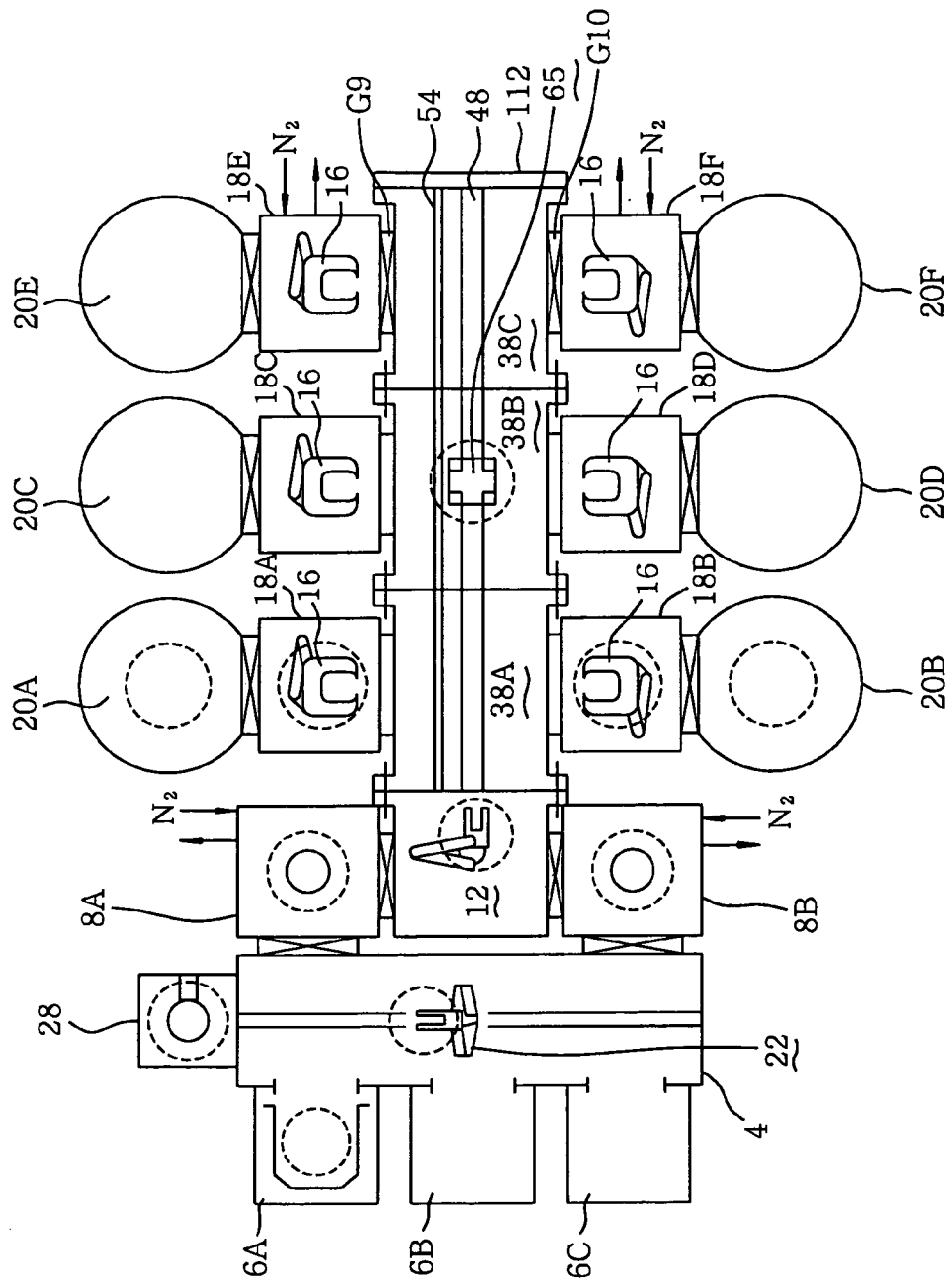
FIG. 9 describes a second modified example of the processing system of FIG. 1.

As in a second modified example illustrated in FIG. 9, the individual transfer mechanisms 18E, 18F may be connected to the transfer mechanism unit 38C via gate valves G9, G10, respectively, instead of the connection tubes, if necessary. At this time, it is preferable to furnish a N₂ gas introduction system and a vacuum exhausting system to each of the individual transfer mechanisms 18E, 18F. The individual transfer mechanisms 18E, 18F can be hermetically separated from the main transfer chamber 44 by corresponding gate valves G9, G10, thereby preventing the atmosphere contaminated by the particles in the processing apparatuses 20E, 20F from flowing into the main transfer chamber 44. Further, by making the individual transfer mechanisms 18E, 18F serve as the load-lock mechanisms, a processing apparatus which operates under an atmospheric pressure can be used as the processing apparatuses 20E, 20F.

Figure 10:
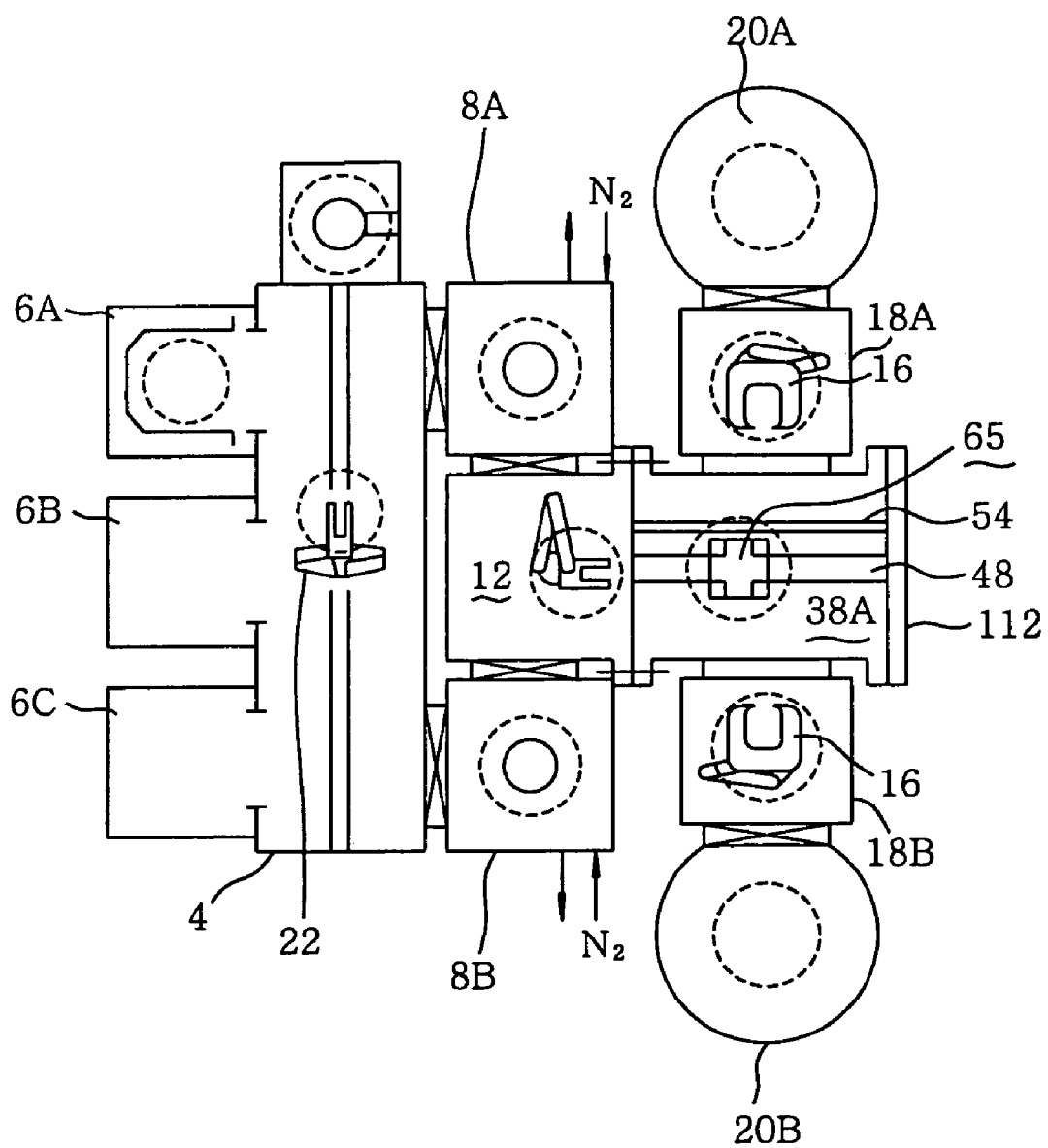
FIG. 10 offers a third modified example of the processing system of FIG. 1.

Though there has been described in the above embodiments a plurality of transfer mechanism units connected in series, the processing system may include the main transfer mechanism 14 which has only a single transfer mechanism unit 38A, as in a third modified example shown in FIG. 10.

Figure 11:
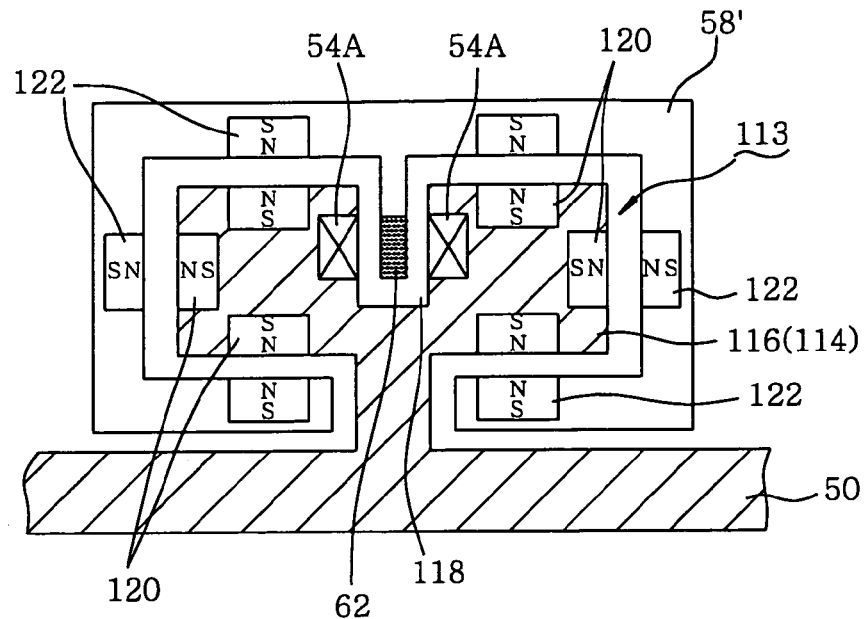
FIG. 11 provides a cross sectional view of a magnetic levitation device for levitating a moving body.
Figure 12:
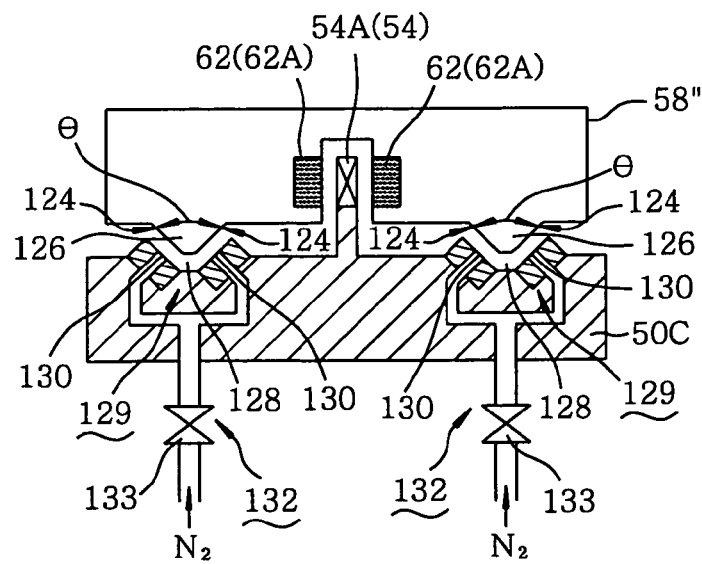
FIG. 12 presents a cross sectional view of a gas jetting levitation device for levitating a moving body.
Figure 13:
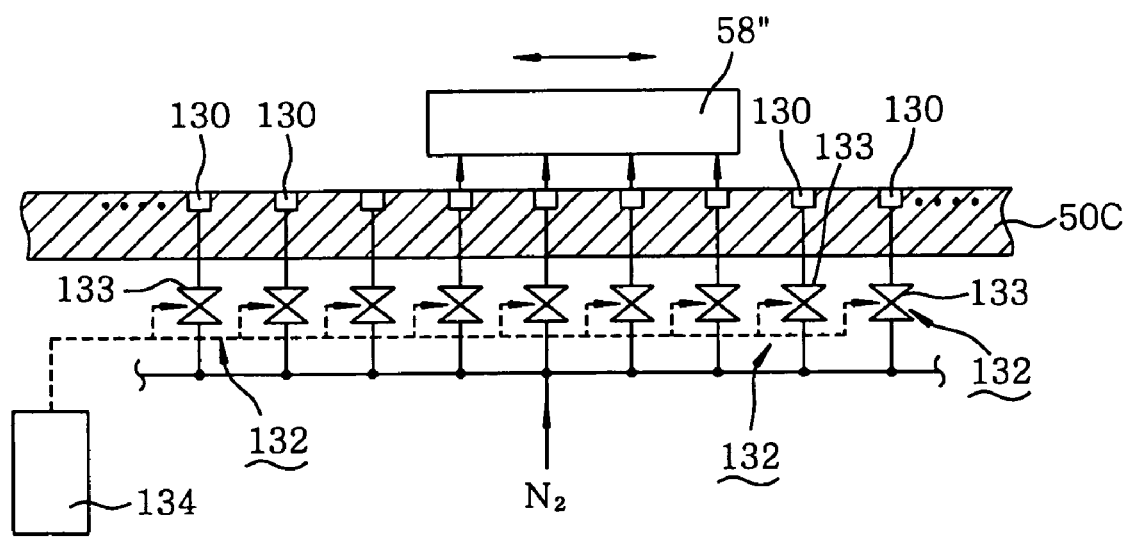
FIG. 13 gives a schematic side view of the gas jetting levitation device of FIG. 12.

Furthermore, though the moving body 58 is slidably moved on the guide rail 48 in the above embodiments, the moving body may be floated up from the guide rail 48 to be moved, as illustrated in FIGS. 11 to 13.

There is shown in FIG. 11 a structure of a magnetic levitation device for levitating a moving body 58'. In this structure, a guide rail 114 includes a rail main body 116 installed at the bottom wall of the casing segment 50. The rail main body 116 has a substantially T-shaped cross section, and the moving body 58' surrounds the rail main body 116 with a space therebetween in a cross sectional view.

A groove portion 118 is formed at a center portion of an upper surface of the rail main body 116, and a pair of armature coil segments 54A is correspondingly disposed at opposite sides of the groove portion 118. The field magnet 62 formed of the permanent magnet is installed in the moving body 58' to be located between the pair of armature coil segments 54A. In this way, a linear motor mechanism for exerting a horizontal driving force to the moving body 58' is formed.

There are installed at a peripheral portion of the rail main body 116 a plurality of fixed magnets 120 made of, e.g., the permanent magnets. At an inner peripheral portion of the moving body 58, a plurality of moving magnets 122 made of, e.g., respective permanent magnets, are disposed to face the fixed magnets 120. The respective polarities of the fixed magnets 120 and the moving magnets 122, which face to each other, are set opposite to create a repulsive force therebetween. Thus, the magnetic levitation device for levitating the moving body 58' from the guide rail 114 all the time is configured.

By such magnetic levitation device, the generation of the particles due to the sliding motion of the moving body 58' can be prevented. Meanwhile, it should be noted that the armature coil segment or an electromagnet may be used as the fixed magnet. Further, the guide rail 114 may be placed at the sidewall of the casing segment 50 as the guide rail 48 shown in FIG. 3.

FIGS. 12 and 13 present a structure of a gas jetting levitation device for levitating a moving body 58'' by using a gas. In this structure, the armature coil segment 54A is disposed at and protruded upward from a block 50C installed on the bottom portion of the casing segment 50, as illustrated in FIG. 12. At a center portion of a lower portion of the moving body 58'', the field magnet 62 formed of a pair of permanent magnets is installed such that the armature coil segment 54A is interposed therebetween. In this way, a linear motor mechanism for exerting a horizontal driving force to the moving body 58'' is formed.

There are formed at both sides of a bottom surface of the moving body 58'' a pair of protrusions 126 extended in the longitudinal axis direction. Each protrusion 126 has a couple of gas receiving surfaces 124 forming an included angle θ of about 90 degrees. Prepared on an upper surface of the block 50C is a couple of gas jetting units 129 corresponding to the protrusions 126 of the moving body 58'', respectively. Each gas jetting unit 129 is provided with a gas jetting groove 128 having a substantially triangular cross sectional shape and extending in the longitudinal axis direction. Further, a plurality of gas nozzles 130 is formed at each side surface of the gas jetting groove 128, which faces the corresponding gas receiving surface 124 of the protrusion 126.

Referring to FIG. 13, each pair of gas nozzles 130 is connected to a gas supplying unit 132 via an opening/closing valve 133. Sets of the gas supplying unit 132 and each pair of gas nozzles 130 are disposed in the longitudinal axis direction to be spaced apart from each other at a predetermined distance (FIG. 13) by two sets (in FIG. 12). Further, a gas jet controller 134 is provided for controlling the opening/closing of the valves 133 of gas supplying units 132, as shown in FIG. 13. The gas jet controller 134 controls the opening/closing of the respective gate valves 133 in order to selectively jet a N₂ gas, i.e., jet the N₂ gas only from the gas nozzles 130 located under and right before the moving body 58'' while the moving body 58'' is moving. With such arrangements, the gas jetting levitation device for levitating the moving body 58'' all the time is provided. By the gas jetting levitation device, generation of the particles due to the sliding motion of the moving body 58'' can be prevented, as in the magnetic levitation device.

Although, in the above embodiment, there has been described the case where the semiconductor wafer is employed as an object to be processed, the present invention is not limited thereto. The present invention may be applied to, e.g., a case where an LCD substrate or a glass substrate is employed as the object to be processed.

While the invention has been shown and described with respect to the preferred embodiments with reference to the accompanying drawings, but the present invention is not limited thereto. The present invention will be understood by those skilled in the art that various changes and modifications may be made without departing from the spirit and scope of the invention as defined in the following claims.

What is claimed is:

1. A transfer mechanism for transferring an object to be processed, comprising:
    a casing for defining a transfer chamber under a vacuum state, the casing having a transfer port for transferring the object between the transfer chamber and an outside thereof;
    a guide rail substantially horizontally installed in the transfer chamber;
    a moving part including a moving body movably installed on the guide rail and a holding body for holding the object;
    a horizontally driving unit for moving the moving body of the moving part along the guide rail;
    a position detecting linear scale installed on the moving part and extending in a moving direction of the moving part; and
    a plurality of position detecting sensors installed at a height corresponding to the linear scale on an inner surface of the casing, the position detecting sensors being disposed in the moving direction of the moving part such that a distance between two neighboring position detecting sensors is shorter than a length of the linear scale.

2. The transfer mechanism of claim 1, wherein the moving part further includes a supporting member for vertically movably connecting the holding body to the moving body, and
the transfer mechanism further includes an elevation mechanism for raising and lowering the supporting member with respect to the moving body.

3. The transfer mechanism of claim 2, wherein a horizontally transferring unit for moving the object only in a horizontal direction through the transfer port is installed in the outside of the casing; and
the elevation mechanism performs a positioning of the object held in the holding body to a height corresponding to the horizontally transferring unit.

4. The transfer mechanism of claim 2, wherein the moving body includes a stopper for restricting the lowest position of the supporting member and moves while the supporting member is at the lowest position thereof.

5. The transfer mechanism of claim 2, wherein the elevation mechanism includes:
a push rod extending through a bottom portion of the casing and making a contact with the supporting member;
a vertically driving unit disposed in the outside of the casing, for raising and lowering the push rod; and
a sealing unit for airtightly sealing a gap between the push rod and the casing.

6. The transfer mechanism of claim 1, wherein the horizontally driving unit is a linear motor mechanism including armature coils installed in the casing along the moving direction of the moving body and a field magnet installed on the moving body; and
a separation wall for airtightly separating the armature coil from the inside of the transfer chamber is installed in the casing.

7. The transfer mechanism of claim 1, further comprising a magnetic levitation device for levitating the moving body from the guide rail.

8. The transfer mechanism of claim 1, further comprising a gas jetting levitation device for levitating the moving body from the guide rail.

9. The transfer mechanism of claim 2, wherein a partition wall for dividing the transfer chamber into an upper portion and a lower portion is installed in the casing;
the holding body of the moving part is disposed in the upper portion of the transfer chamber while the moving body of the moving part is disposed in the lower portion of the transfer chamber;
the partition wall has a slit for allowing the supporting member of the moving part to move therethrough; and
the transfer mechanism further includes:
a gas supplying system for supplying an inactive gas to the upper portion of the transfer chamber, and
a gas exhausting system for evacuating the gas from the lower portion of the transfer chamber.

10. A processing system comprising:
(a) a main transfer mechanism including:
a casing for defining a main transfer mechanism under a vacuum state, the casing having a plurality of transfer ports;
a guide rail substantially horizontally installed inside the transfer chamber under the vacuum state;
a moving body movably installed on the guide rail;
a horizontally driving unit for moving the moving body along the guide rail;
an elevation supporting structure having a holding body for holding an object to be processed and a supporting member for vertically movably connecting the holding body to the moving body; and
an elevation mechanism for raising and lowering the supporting member of the elevation supporting structure with respect to the moving body;
(b) an auxiliary transfer mechanism including a casing for defining an auxiliary transfer chamber under a vacuum state which selectively communicates with the main transfer chamber; and an auxiliary transfer unit installed in the auxiliary transfer chamber;
(c) a load-lock mechanism including a casing for defining a load-lock chamber which selectively communicates with the auxiliary transfer chamber and is selectively evacuated;
(d) an entrance transfer mechanism including a casing for defining an entrance transfer chamber under an atmospheric state which selectively communicates with the load-lock chamber; and an entrance transfer unit installed in the entrance transfer chamber;
(e) a cassette station connected to the entrance transfer chamber, for mounting therein a cassette container which accommodates a plurality of objects to be processed;
(f) a plurality of individual transfer mechanisms installed to correspond to the respective transfer ports of the main transfer mechanism, each of the individual transfer mechanisms including a casing for defining an individual transfer chamber under a vacuum state which selectively communicates with the main transfer chamber via the corresponding transfer port; and an individual transfer unit installed in the individual transfer chamber; and
(g) a plurality of processing apparatuses installed to correspond to the respective individual transfer mechanisms, each of the processing apparatuses including a casing for defining a vacuum processing chamber which selectively communicates with the corresponding individual transfer chamber, and performing a predetermined process on the object therein.

11. The processing system of claim 10, wherein the casing of the main transfer mechanism includes at least one of a plurality of casing segments connectable with each other, each of the casing segments having at least one of the transfer ports; and
the guide rail includes at least one of a plurality of guide rail segments connectable with each other.

12. A processing system comprising:
(a) a main transfer mechanism including:
a casing for defining a main transfer mechanism under a vacuum state, the casing having a plurality of transfer ports;
a guide rail substantially horizontally installed inside the transfer chamber under the vacuum state;
a moving part having a moving body movably installed on the guide rail and a holding body for holding an object to be processed;
a horizontally driving unit for moving the moving body of the moving part along the guide rail; and
a plurality of position detecting sensors for detecting the position of the moving part, the position detecting sensors being disposed in the casing in a moving direction of the moving part such that neighboring position detecting sensors are spaced from each other;
(b) an auxiliary transfer mechanism including a casing for defining an auxiliary transfer chamber under a vacuum state which selectively communicates with the main transfer chamber; and an auxiliary transfer unit installed in the auxiliary transfer chamber;

(c) a load-lock mechanism including a casing for defining a load-lock chamber which selectively communicates with the auxiliary transfer chamber and is selectively evacuated;

(d) an entrance transfer mechanism including a casing for defining an entrance transfer chamber under an atmospheric state which selectively communicates with the load-lock chamber; and an entrance transfer unit installed in the entrance transfer chamber;

(e) a cassette station connected to the entrance transfer chamber, for mounting therein a cassette container which accommodates a plurality of objects to be processed;

(f) a plurality of individual transfer mechanisms installed to correspond to the respective transfer ports of the main transfer mechanism, each of the individual transfer mechanisms including a casing for defining an individual transfer chamber under a vacuum state which selectively communicates with the main transfer chamber via the corresponding transfer port; and an individual transfer unit installed in the individual transfer chamber; and (g) a plurality of processing apparatuses installed to correspond to the respective individual transfer mechanisms, each of the processing apparatuses including a casing for defining a vacuum processing chamber which selectively communicates with the corresponding individual transfer chamber, and performing a predetermined process on the object therein.

13. A transfer mechanism for transferring an object to be processed, comprising:

a casing for defining a transfer chamber under a vacuum state, the casing having a transfer port for transferring the object between the transfer chamber and an outside thereof;

a guide rail substantially horizontally installed inside the transfer chamber under the vacuum state;

a moving part including a moving body movably installed on the guide rail and a holding body for holding the object;

a horizontally driving unit for moving the moving body of the moving part along the guide rail; and a plurality of position detecting sensors for detecting the position of the moving part, the position detecting sensors being disposed in the casing in a moving direction of the moving part such that neighboring position detecting sensors are spaced from each other, wherein the moving part further includes a supporting member for vertically movably connecting the holding body to the moving body, and the transfer mechanism further includes an elevation mechanism for raising and lowering the supporting member with respect to the moving body, and wherein the transfer mechanism further comprises:

a position detecting linear scale installed on at least one of the moving body, the holding body and the supporting member and extending in the moving direction of the moving body, wherein the position detecting sensors are installed at a height corresponding to the linear scale on an inner surface of the casing, the position detecting sensors being disposed in the moving direction of the moving body such that a distance between two neighboring position detecting sensors is shorter than a length of the linear scale.

* * * * *